(12) United States Patent
Asano et al.

(10) Patent No.: US 11,932,964 B2
(45) Date of Patent: Mar. 19, 2024

(54) POLYCRYSTALLINE SILICON MATERIAL

(71) Applicant: Tokuyama Corporation, Yamaguchi (JP)

(72) Inventors: Takuya Asano, Yamaguchi (JP); Kouichi Saiki, Yamaguchi (JP); Miki Emoto, Yamaguchi (JP); Tooru Onoda, Yamaguchi (JP)

(73) Assignee: Tokuyama Coporation, Yamaguchi (JP)

( * ) Notice: Subject to any disclaimer, the term of this patent is extended or adjusted under 35 U.S.C. 154(b) by 281 days.

(21) Appl. No.: 17/601,452

(22) PCT Filed: Apr. 2, 2020

(86) PCT No.: PCT/JP2020/015226
§ 371 (c)(1),
(2) Date: Oct. 5, 2021

(87) PCT Pub. No.: WO2020/204143
PCT Pub. Date: Oct. 8, 2020

(65) Prior Publication Data
US 2022/0195621 A1    Jun. 23, 2022

(30) Foreign Application Priority Data
Apr. 5, 2019 (JP) ................................. 2019-073020

(51) Int. Cl.
*C30B 29/06* (2006.01)
*C30B 15/04* (2006.01)
*C30B 30/00* (2006.01)

(52) U.S. Cl.
CPC .............. *C30B 29/06* (2013.01); *C30B 15/04* (2013.01); *C30B 30/00* (2013.01)

(58) Field of Classification Search
CPC ........ C30B 29/38; C30B 29/92; C04B 35/581
See application file for complete search history.

(56) References Cited

U.S. PATENT DOCUMENTS 5,798,137 A  *  8/1998 Lord .................. B01J 8/245
                                                   423/349
8,926,749 B2 *  1/2015 Arvidson ............... B07B 13/04
                                                   117/17
(Continued)

FOREIGN PATENT DOCUMENTS

EP      WO2017172748      * 10/2017
JP      2004315336 A      11/2004
(Continued)

OTHER PUBLICATIONS

International Preliminary Report on Patentability for Application No. PCT/JP2020/015226, dated Oct. 14, 2021.
(Continued)

*Primary Examiner* — Robert M Kunemund
(74) *Attorney, Agent, or Firm* — CAHN & SAMUELS, LLP

(57) ABSTRACT

A polycrystalline silicon material for producing silicon single crystal, containing a plurality of polycrystalline silicon chunks, in which assuming that a total concentration of donor elements present inside a bulk body of the polycrystalline silicon material is Cd1 [ppta], a total concentration of acceptor elements present inside the bulk body of the polycrystalline silicon material is Ca1 [ppta], a total concentration of the donor elements present on a surface of the polycrystalline silicon material is Cd2 [ppta], and a total concentration of the acceptor elements present on the surface of the polycrystalline silicon material is Ca2 [ppta], Cd1, Ca1, Cd2, and Ca2 satisfy a relation of 5 [ppta]≤(Ca1+Ca2)−(Cd1+Cd2)≤26 [ppta].

8 Claims, 1 Drawing Sheet

(56) References Cited

U.S. PATENT DOCUMENTS

| | | |
|---|---|---|
| 9,073,756 B2 | 7/2015 | Wochner et al. |
| 11,056,381 B2 | 7/2021 | Ishizuka et al. |
| 2005/0000410 A1 | 1/2005 | Takase et al. |
| 2013/0189176 A1* | 7/2013 | Wochner ............... C01B 33/037 423/348 |
| 2018/0237937 A1 | 8/2018 | Kang et al. |

FOREIGN PATENT DOCUMENTS

| | | |
|---|---|---|
| JP | 2013151413 A | 8/2013 |
| JP | 201415376 A | 8/2014 |
| JP | 2014156376 A | 8/2014 |
| JP | 2016108160 A | 6/2016 |
| JP | 2017069240 A | 4/2017 |
| JP | 2018090466 A | 6/2018 |
| JP | 2018095515 A | 6/2018 |
| JP | 2018525308 A | 9/2018 |

OTHER PUBLICATIONS

English Abstract for JP201415376 A, Aug. 28, 2014.
English Abstract for JP2016108160 A, Jun. 20, 2016.
English Abstract for JP2018090466 A, Jun. 14, 2018.
English Abstract for JP2018095515 A, Jun. 21, 2018.
English Abstract for JP2018525308 A, Sep. 6, 2018.
English Abstract for JP 2017069240 A, Apr. 6, 2017.
English Abstract of JP2014156376A, Aug. 28, 2014.
Extended European Search Report, dated Aug. 17, 2022.

* cited by examiner

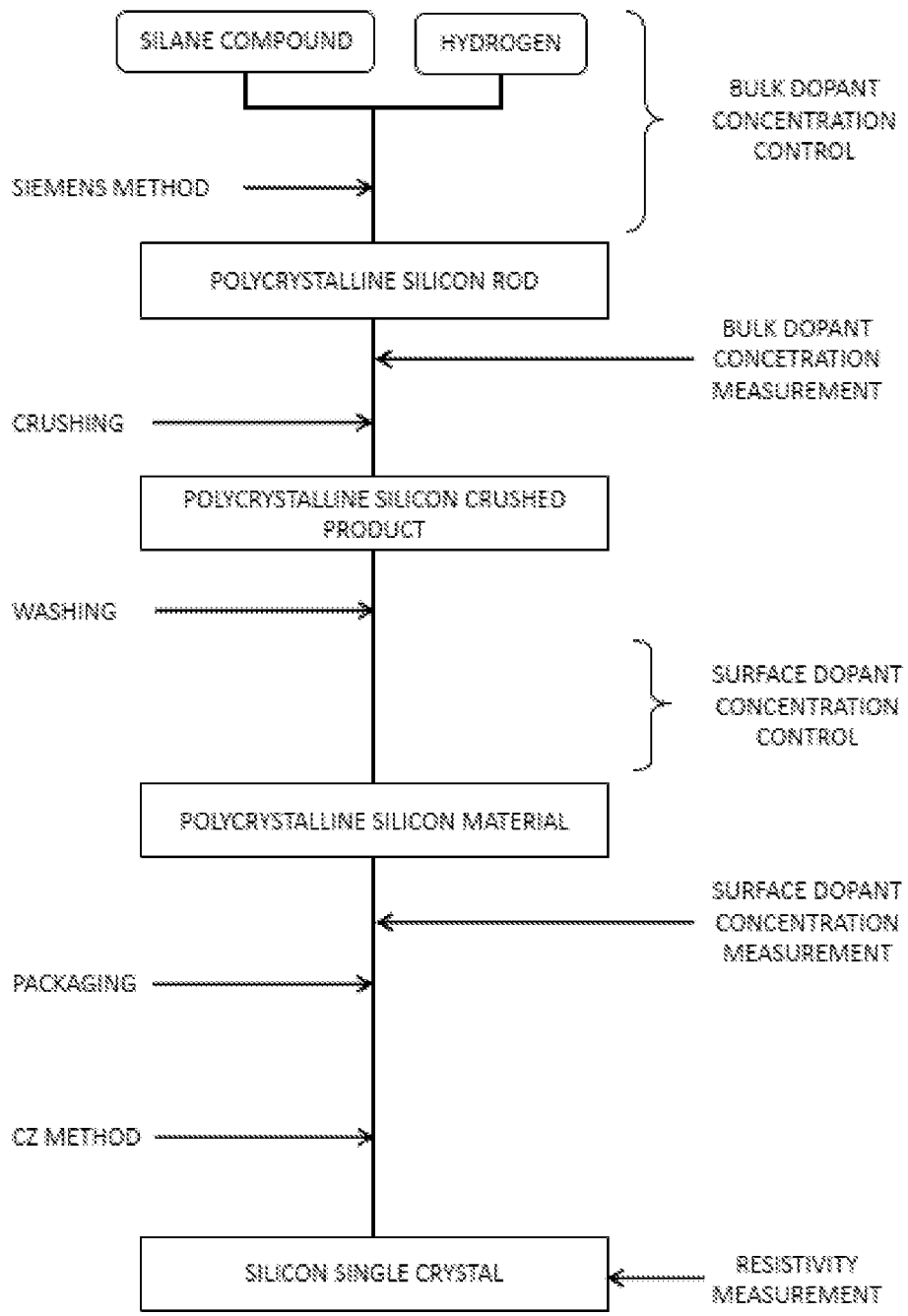

POLYCRYSTALLINE SILICON MATERIAL

This application is a U.S. national stage application of PCT/JP2020/015226 filed on 2 Apr. 2020 and claims priority to Japanese patent document 2019-073020 filed on 5 Apr. 2019, the entireties of which are incorporated herein by reference.

TECHNICAL FIELD

The present invention relates to a polycrystalline silicon material. In particular, the present invention relates to a polycrystalline silicon material for producing silicon single crystal having a high resistivity.

BACKGROUND OF THE INVENTION

Silicon single crystal is an extremely important material in industry, and is used as semiconductor wafers, solar cells, high-frequency devices, substrates of various elements such as sensors and the like. When the silicon single crystal is used as the substrate of various elements, the substrate is required to be silicon single crystal having a high resistivity in order to suppress the movement of electric charges in the substrate. For example, as described in Patent Literature 1, a substrate having a resistivity of several thousand Ωcm is required.

The silicon single crystal is obtained as a silicon single crystal ingot by bringing a seed crystal into contact with a silicon melt obtained by melting a polycrystalline silicon material. A Czochralski (CZ) method and a floating zone (FZ) method are known as methods for obtaining the silicon single crystal ingot.

Conventionally, the silicon single crystal having a high resistivity has been produced by the FZ method. However, it is difficult to produce a large-diameter ingot by the FZ method, which is disadvantageous in terms of cost.

Therefore, it has been attempted to produce the silicon single crystal having a high resistivity by the CZ method, which can relatively easily produce a large-diameter ingot having a diameter of 300 mm or more and is less expensive than the FZ method.

For example, Patent Literature 2 discloses that silicon single crystal having a high resistivity can be obtained by using a polycrystalline silicon material in which a difference in impurity concentration (difference between a donor concentration and an acceptor concentration) in the polycrystalline silicon material is controlled within a specific range.

However, a surface of the polycrystalline silicon material is usually contaminated, and various impurity elements are present on the surface. Such impurity elements include Dopant elements (donor elements and acceptor elements). A distinction is made between Dopant elements present on the surface of the polycrystalline silicon material (surface dopant elements) and dopant elements present inside a bulk body of the polycrystalline silicon material (bulk dopant elements).

However, When the polycrystalline silicon material is melted, the surface dopant elements are contained in the silicon melt together with the bulk dopant elements. Therefore, when pulling up the silicon single crystal, the surface dopant elements are incorporated into the silicon single crystal as the bulk dopant elements. As a result, the surface dopant elements of the polycrystalline silicon material affect the resistivity of the silicon single crystal.

In particular, as the polycrystalline silicon material used in the CZ method, a fragmentary raw material (a polycrystalline silicon chunk) obtained by crushing a polycrystalline silicon rod is used. Therefore, a surface area of the polycrystalline silicon material made of the polycrystalline silicon chunk becomes much larger than a surface area of the rod-shaped polycrystalline silicon material used in the FZ method. Since an amount of the surface dopant elements is proportional to the surface area, an effect of the surface dopant elements on the resistivity of the silicon single crystal is extremely large in the CZ method.

Furthermore, a size of the polycrystalline silicon chunk in the polycrystalline silicon material is not constant and has a predetermined particle size distribution. Since the surface area of the polycrystalline silicon chunk corresponds to the size of the polycrystalline silicon chunk, the amount of the surface dopant elements varies depending on the size of the polycrystalline silicon chunk.

Therefore, in production of the silicon single crystal having a high resistivity, techniques that focus not only on the bulk dopant elements but also on the surface dopant elements of the polycrystalline silicon material are known. For example, Patent Literature 3 discloses that a concentration of surface dopant elements and a concentration of bulk dopant elements in a polycrystalline silicon material are each set within a predetermined range. Further, Patent Literatures 4 and 5 disclose that measuring concentrations of surface dopant elements and bulk dopant elements in a polycrystalline silicon material, and adding dopants so as to achieve the desired resistivity based on the measurement results.

CITATION LIST

Patent Literature

Patent Literature 1: JP-A-2017-69240
Patent Literature 2: JP-A-2004-315336
Patent Literature 3: JP-A-2013-151413
Patent Literature 4: JP-A-2014-156376
Patent Literature 5: JP-A-2018-90466

SUMMARY OF INVENTION

Technical Problem

In recent years, there has been a demand for the silicon single crystal having a higher resistivity, for example, a resistivity of 10,000 Ωcm or higher. In order to obtain such silicon single crystal having a very high resistivity, it is preferable to adjust an amount of dopant elements contained in the polycrystalline silicon material without adding any dopant.

However, Patent Literature 2 does not suggest controlling the concentration of the bulk dopant elements in the polycrystalline silicon material, and simply discloses using a material in which the difference between the donor concentration and the acceptor concentration in the material are controlled within a specific range by combining various polycrystalline silicon materials. Moreover, no attention is paid to the concentration of the surface dopant elements of the polycrystalline silicon material.

Therefore, there is a problem that silicon single crystal having a conduction type opposite to a desired conduction type may be obtained depending on the concentration of the surface dopant elements. Alternatively, there is a problem that a desired resistivity cannot be obtained even with silicon single crystal having a desired conduction type.

In the first place, an objective of Patent Literature 2 is to produce silicon single crystal having a resistivity of approximately 2,000 Ωcm. Even if the difference between the donor concentration and the acceptor concentration in the polycrystalline silicon material is set within a range described in Patent Literature 2, it is not possible to produce silicon single crystal having a resistivity of, for example, 10,000 Ωcm or more.

Patent Literature 3 focuses on the concentration of the surface dopant elements and the concentration of the bulk dopant elements, but merely specifies respective concentration ranges. Therefore, there is a problem that the silicon single crystal having a conduction type opposite to a desired conduction type may be obtained, depending on a magnitude relation between the donor concentration and the acceptor concentration in the surface dopant elements, and the donor concentration and the acceptor concentration in the bulk dopant elements. Alternatively, there is a problem that a desired resistivity cannot be obtained even if the silicon single crystal has a desired conduction type.

Similar to Patent Literature 2, Patent Literatures 4 and 5 do not suggest controlling the concentration of the surface dopant elements and the concentration of the bulk dopant elements of the polycrystalline silicon material and disclose adding a dopant to adjust a resistivity of silicon single crystal based on measurement results of the concentration of the surface dopant elements and the concentration of the bulk dopant elements.

However, similar to Patent Literature 2, the objective of both Patent Literatures 4 and 5 is to produce silicon single crystal having a resistivity of approximately several thousand Ωcm. Therefore, for example, when attempting to obtain silicon single crystal having a resistivity of 10,000 Ωcm or higher by the method disclosed in Patent Literature 4, an addition amount of the dopant must be minimal. There is a problem that an error becomes large in weighing such a minimal addition amount of the dopant, and thus it is difficult to obtain a desired resistivity.

Moreover, in these patent literatures, intended dopant elements are, specifically, only phosphorus (P) for a donor element, and only boron (B) for an acceptor element. For these reasons, a desired value of the resistivity of the silicon single crystal obtained without adding the dopant in this way cannot be obtained. As a result, unless the above-mentioned dopant is added and adjusted, it is difficult to control not only the conduction type but also the resistivity to a desired high value.

The present invention is made in view of such a circumstance, and an object thereof is to provide a polycrystalline silicon material for producing silicon single crystal having a conduction type of p-type and accurately exhibiting a desired high resistivity without adding a dopant.

Solution to Problem

The present inventors have found that in a polycrystalline silicon material, by taking into consideration all acceptors and donors that affect a resistivity and making a balance therebetween within a predetermined range, silicon single crystal having a desired conduction type and accurately exhibiting a desired resistivity can be obtained even if the desired resistivity is high.

In order to achieve the above-mentioned object, aspects of the present invention are as follows.

[1] A polycrystalline silicon material for producing silicon single crystal, containing: a plurality of polycrystalline silicon chunks, in which assuming that a total concentration of donor elements present inside a bulk body of the polycrystalline silicon material is $Cd1$ [ppta], a total concentration of acceptor elements present inside the bulk body of the polycrystalline silicon material is $Ca1$ [ppta], a total concentration of the donor elements present on a surface of the polycrystalline silicon material is $Cd2$ [ppta], and a total concentration of the acceptor elements present on the surface of the polycrystalline silicon material is $Ca2$ [ppta], $Cd1$, $Ca1$, $Cd2$, and $Ca2$ satisfy a relation 5 [ppta]≤$(Ca1+Ca2)-(Cd1+Cd2)$≤26 [ppta].

[2] The polycrystalline silicon material according to [1], in which assuming that a total weight of the polycrystalline silicon chunks contained in the polycrystalline silicon material is 100%, a weight of polycrystalline silicon chunks having a maximum length of 10 mm or more and 45 mm or less is 90% or more.

[3] The polycrystalline silicon material according to [1], in which assuming that a total weight of the polycrystalline silicon chunks contained in the polycrystalline silicon material is 100%, a weight of polycrystalline silicon chunks having a maximum length of 20 mm or more and 70 mm or less is 90% or more.

[4] The polycrystalline silicon material according to [1], in which assuming that a total weight of the polycrystalline silicon chunks contained in the polycrystalline silicon material is 100%, a weight of polycrystalline silicon chunks having a maximum length of 60 mm or more and 100 mm or less is 90% or more.

Advantageous Effects of Invention

According to the present invention, it is possible to provide a polycrystalline silicon material for producing silicon single crystal having a conduction type of p-type and accurately exhibiting a desired high resistivity without adding a dopant.

BRIEF DESCRIPTION OF DRAWINGS

FIG. 1 is a process diagram of a method for producing a polycrystalline silicon material according to the present embodiment and a method for producing silicon single crystal using the polycrystalline silicon material according to the present embodiment.

DESCRIPTION OF EMBODIMENTS

Hereinafter, the present invention will be described in detail in the following order based on a specific embodiment.
1. Polycrystalline Silicon Material
2. Method for Producing Polycrystalline Silicon Material
  2.1. Production of Polycrystalline Silicon Rod
  2.2. Crushing of Polycrystalline Silicon Rod
  2.3. Washing of Polycrystalline Silicon Crushed Product
  2.4. Polycrystalline Silicon Material 3. Dopant Concentration Control of Polycrystalline Silicon Material
　3.1. Bulk Dopant Concentration Control of Polycrystalline Silicon Material
　　3.1.1. Measurement of Bulk Dopant Concentration
　3.2. Surface Dopant Concentration Control of Polycrystalline Silicon Material
　　3.2.1. Measurement of Surface Dopant Concentration
4. Summary of Embodiment

1. POLYCRYSTALLINE SILICON MATERIAL

A polycrystalline silicon material according to the present embodiment contains a plurality of polycrystalline silicon chunks. The polycrystalline silicon chunks are obtained by washing a polycrystalline silicon crushed product obtained by crushing a polycrystalline silicon rod produced by a known method.

The polycrystalline silicon material according to the present embodiment is suitably used for producing silicon single crystal having a conduction type of p-type. When carriers present in the silicon single crystal are positive holes, the conduction type is p-type, and when the carriers are free electrons, the conduction type is n-type.

Examples of acceptor elements that supply the positive holes in the silicon single crystal include boron (B), aluminum (Al), gallium (Ga), and indium (In). Examples of donor elements that supply the free electrons include phosphorus (P), arsenic (As), and antimony (Sb). Therefore, in the silicon single crystal having a conduction type of p-type, majority carriers that carry electric charges are the positive holes.

Therefore, in order to produce the silicon single crystal having a conduction type of p-type, in the present embodiment, by considering all dopants (the acceptor elements and the donor elements) present in the polycrystalline silicon material used as a raw material for the silicon single crystal, making an acceptor element concentration higher than a donor element concentration, and resulting in the majority carriers as positive holes, the silicon single crystal having a conduction type of p-type can be easily obtained.

Meanwhile, a resistivity of the silicon single crystal having a conduction type of p-type corresponds to the acceptor element concentration, that is, the number of carriers in the silicon single crystal. When the acceptor element concentration is high, the resistivity is low since the number of the positive holes as carriers is large. Therefore, in order to obtain silicon single crystal having a high resistivity, it is necessary to reduce the acceptor element concentration.

However, the present inventors focused on the fact that the acceptor element concentration does not have to be a total concentration of the acceptor elements present in the silicon single crystal, but an effective acceptor element concentration that actually contributes to the resistivity. When the acceptor elements and the donor elements are present in the silicon single crystal, carriers derived from the acceptor elements (positive holes) and carriers derived from the donor elements (free electrons) cancel each other out. Therefore, from a viewpoint of the number of carriers, a difference between the acceptor element concentration and the donor element concentration becomes the effective acceptor element concentration, and the number of effective carriers corresponding to the effective acceptor element concentration is reflected in the resistivity.

In other words, by setting the effective acceptor element concentration within a predetermined range, the resistivity of the silicon single crystal having a conduction type of p-type can be set within a predetermined range.

Here, in a silicon single crystal pulling step, dopant contamination caused by external factors other than the polycrystalline silicon material can be reduced to an extremely small amount. Therefore, in order to control the effective acceptor element concentration in the silicon single crystal, as described above, it is sufficient to consider all the dopants (the acceptor elements and the donor elements) present in the polycrystalline silicon material used as the raw material of the silicon single crystal, and to control a concentration thereof. The acceptor elements and the donor elements present in the polycrystalline silicon material consist of a dopant (bulk dopant) present inside a bulk body of the polycrystalline silicon material and a dopant (surface dopant) present on a surface of the polycrystalline silicon material.

Therefore, in the present embodiment, a difference between a total concentration of the acceptor elements present inside the bulk body and on the surface of the polycrystalline silicon material and a total concentration of the donor elements present inside the bulk body and on the surface of the polycrystalline silicon material is controlled within a specific range.

Specifically, assuming that a total concentration of the donor elements present inside the bulk body of the polycrystalline silicon material is $Cd1$ [ppta], a total concentration of the acceptor elements present inside the bulk body of the polycrystalline silicon material is $Ca1$ [ppta], a total concentration of the donor elements present on the surface of the polycrystalline silicon material is $Cd2$ [ppta], and a total concentration of the acceptor elements present on the surface of the polycrystalline silicon material is $Ca2$ [ppta], $Cd1$, $Ca1$, $Cd2$, and $Ca2$ satisfy the following relation.

$$5 \text{ [ppta]} \leq (Ca1+Ca2)-(Cd1+Cd2) \leq 26 \text{ [ppta]}$$

Here, the above total concentration ($Cd2$) of the donor elements and total concentration ($Ca2$) of the acceptor elements on the surface of the polycrystalline silicon material are not indicated as an amount of the donor elements and an amount of the acceptor elements on the surface of the polycrystalline silicon material with respect to the surface of the polycrystalline silicon material. These are values indicating an amount of each surface dopant element as a value with respect to the atomic weight of silicon of the polycrystalline silicon material, as is clear from calculation formulas described later.

By using the polycrystalline silicon material in which the acceptor element concentration and the donor element concentration are controlled within the above range, a dopant concentration in the bulk of the produced silicon single crystal substantially reflects a concentration derived from the polycrystalline silicon material. Therefore, by controlling the acceptor element concentration and the donor element concentration in the polycrystalline silicon material as described above, the produced silicon single crystal has a desired conduction type and can accurately exhibit a desired resistivity.

An upper limit of 26 [ppta] in the above relation corresponds to a theoretical acceptor element concentration in silicon single crystal showing a resistivity of approximately 10,000 [Ωcm]. That is, in the above relation, by setting the upper limit of the effective acceptor element concentration in the polycrystalline silicon material to 26 [ppta], it is possible to obtain silicon single crystal having a conduction type of p-type and a resistivity of approximately 10,000 [Ωcm].

On the other hand, a lower limit of 5 [ppta] in the above relation corresponds to a theoretical acceptor element concentration in silicon single crystal showing a resistivity of approximately 50,000 [Ωcm]. Since silicon single crystal having a resistivity of more than 50,000 [Ωcm]exhibits a dopant concentration at a level close to that of an intrinsic semiconductor, a magnitude relation between the acceptor element concentration and the donor element concentration may be reversed due to slight changes in the acceptor element concentration or the donor element concentration. As a result, silicon single crystal having a conduction type opposite to a desired conduction type, that is, n-type, may be obtained.

From a viewpoint of more reliably obtaining a P-type silicon single crystal having a resistivity of 10,000 [Ωcm] or more, it is more preferable that Cd1, Ca1, Cd2, and Ca2 satisfy the following relation.

10 [ppta]≤(Ca1+Ca2)−(Cd1+Cd2)≤20 [ppta]

During pulling up of the silicon single crystal, phosphorus, which is a donor element, and boron, which is an acceptor element, are incorporated into the silicon single crystal. Phosphorus and boron have different segregation coefficients. Since boron having a segregation coefficient of 0.8 hardly segregates into the silicon single crystal, a boron concentration in the silicon single crystal does not change much between an initial stage of the pulling up and a late stage of the pulling up. On the other hand, phosphorus having a segregation coefficient of 0.35 is more likely to segregate than boron, and although a phosphorus concentration in the silicon single crystal is low at the initial stage of the pulling up, the phosphorus concentration in the silicon single crystal increases in the late stage of the pulling up. As a result, in the pulled-up silicon single crystal, the magnitude relation between the acceptor element concentration and the donor element concentration may be reversed in a portion obtained at the initial stage of the pulling up and a portion obtained at the late stage of the pulling up, and the conduction type may be reversed. In order to prevent the above circumstance, in the present embodiment, the lower limit is set to 5 [ppta] in the above relation.

In the present embodiment, values of Cd1, Ca1, Cd2, and Ca2 are not particularly limited as long as the effective acceptor element concentration satisfies the above relation. That is, control of absolute values of a bulk dopant concentration and a surface dopant concentration in the polycrystalline silicon material is not so important, and it is important to control the bulk dopant concentration and the surface dopant concentration in cooperation with each other.

Ca1 is usually in a range of 1 [ppta] to 10 [ppta], and from the viewpoint of reliably obtaining the P-type silicon single crystal having a resistivity of 10,000 [Ωcm] or more, Ca1 is preferably in a range of 1 [ppta] to 4 [ppta]. Ca2 is usually in a range of 1 [ppta] to 100 [ppta], and for the same reason as above, Ca2 is preferably in a range of 10 [ppta] to 90 [ppta]. Meanwhile, Cd1 is usually in a range of 1 [ppta] to 80 [ppta], and from the viewpoint of reliably obtaining the P-type silicon single crystal having a resistivity of 10,000 [Ωcm] or more, Cd1 is preferably in a range of 10 [ppta] to 60 [ppta]. Cd2 is usually in a range of 1 [ppta] to 50 [ppta], and for the same reason as above, Cd2 is preferably in a range of 1 [ppta] to 30 [ppta].

2. METHOD FOR PRODUCING POLYCRYSTALLINE SILICON MATERIAL

A method for producing the polycrystalline silicon material according to the present embodiment is not particularly limited, and any known method such as a Siemens method or a fluidized bed method may be used. In the present embodiment, a method for producing the polycrystalline silicon material by the Siemens method will be described with reference to a process diagram shown in FIG. 1.

(2.1. Production of Polycrystalline Silicon Rod)

In the Siemens method, first, a silicon core wire connected to a carbon electrode is placed inside a reaction vessel, the silicon core wire is energized, and the silicon core wire is heated to a temperature equal to or higher than a precipitation temperature of silicon. As shown in FIG. 1, a silane compound gas and a reducing gas are supplied as raw material gases to the heated silicon core wire, and polycrystalline silicon is precipitated on the silicon core wire by a chemical vapor deposition method to obtain a polycrystalline silicon rod.

Examples of the silane compound include monosilane, trichlorosilane, silicon tetrachloride, monochlorosilane, and dichlorosilane. In the present embodiment, trichlorosilane is preferred. As the reducing gas, hydrogen gas is usually used.

The obtained polycrystalline silicon rod contains impurity elements derived from raw material gases (trichlorosilane and hydrogen) and the electrode. Such impurity elements include dopant elements such as boron (B), aluminum (Al), phosphorus (P), and arsenic (As). That is, such dopant elements are bulk dopant elements contained in a bulk of the polycrystalline silicon rod.

In the present embodiment, bulk dopant concentration control, which will be described later, is performed to control concentrations (Cd1 and Ca1) of the bulk dopant elements of the polycrystalline silicon rod within a predetermined range.

(2.2. Crushing of Polycrystalline Silicon Rod)

As shown in FIG. 1, the obtained polycrystalline silicon rod is cut and crushed to a predetermined size to obtain a chunk-like polycrystalline silicon crushed product. Specifically, the polycrystalline silicon rod is crushed into a chunk by a hammer made of a hard metal such as tungsten carbide, a crusher such as a jaw crusher, or the like. Impurity elements due to a material of the hammer or the crusher, environment during the crushing, and the like adhere to a surface of the polycrystalline silicon crushed product after crushing, and the surface is thus contaminated.

Such impurity elements may include the above-mentioned dopant elements. That is, surface dopant elements may be present on the surface of the polycrystalline silicon crushed product. In the presence of the surface dopant elements, during production of the silicon single crystal from a silicon melt obtained by melting the polycrystalline silicon crushed product, the surface dopant elements of the polycrystalline silicon crushed product are incorporated into the silicon single crystal and present as the bulk dopant elements in the silicon single crystal, which greatly influences the conductivity type and the resistivity of the silicon single crystal.

(2.3. Washing of Polycrystalline Silicon Crushed Product)

Therefore, in the present embodiment, as shown in FIG. 1, in order to reduce surface contamination of the polycrystalline silicon crushed product caused by the crushing of the polycrystalline silicon rod, the polycrystalline silicon crushed product is subjected to washing (wet treatment). Specifically, first, the polycrystalline silicon crushed product is brought into contact with a solution containing hydrofluoric acid, nitric acid, and the like, and a surface portion of the polycrystalline silicon crushed product is eluted by etching. By performing such a treatment, the surface dopant elements adhering during crushing can be separated from the polycrystalline silicon crushed product. After etching, the polycrystalline silicon crushed product is rinsed with ultra-pure water or the like and dried.

(2.4. Polycrystalline Silicon Material)

In the present embodiment, as shown in FIG. 1, surface dopant concentration control, which will be described later, is performed on the polycrystalline silicon crushed product after washing to obtain the polycrystalline silicon material.

In the present embodiment, it is preferable that a weight of polycrystalline silicon chunks having a maximum length of 10 mm or more and 45 mm or less is 90% or more when a total weight of the polycrystalline silicon chunks contained in the polycrystalline silicon material satisfying the above effective acceptor element concentration is 100%. It is also preferable that a weight of polycrystalline silicon chunks having a maximum length of 20 mm or more and 70 mm or less is 90% or more when the total weight of the polycrystalline silicon chunks contained in the polycrystalline silicon material satisfying the above effective acceptor element concentration is 100%. It is also preferable that a weight of polycrystalline silicon chunks having a maximum length of 60 mm or more and 100 mm or less is 90% or more when the total weight of the polycrystalline silicon chunks contained in the polycrystalline silicon material satisfying the above effective acceptor element concentration is 100%.

The surface dopant element concentration is taken into consideration in the above-mentioned effective acceptor element concentration. The surface dopant element concentration depends on a surface area of the polycrystalline silicon material. For example, compared to the case where the particle size of the polycrystalline silicon chunk that constitutes the polycrystalline silicon material is small and the case where the particle size of the polycrystalline silicon chunk is large, when the polycrystalline silicon material has the same weight, the smaller particle size of the polycrystalline silicon chunk increases the surface area of the polycrystalline silicon material (the total surface area of the polycrystalline silicon chunks). That is, even if the polycrystalline silicon material has the same weight, the smaller the particle size, the greater the adhesion amount of surface dopant elements is likely to be. Therefore, the surface dopant concentration becomes larger than when the particle size is large, resulting in more difficulty in controlling the conduction type of p-type and achieving the desired high resistivity with precision.

However, in the present embodiment, as will be described later, the surface dopant concentration is controlled in consideration of the particle diameter of the polycrystalline silicon material. As a result, as described above, even when the particle diameters of the polycrystalline silicon chunks constituting the polycrystalline silicon materials are different, the effective acceptor element concentration in the polycrystalline silicon material satisfies the above relation. From a viewpoint of more remarkably achieving this effect, the polycrystalline silicon material is more preferably constituted by chunks having a small particle diameter and a large surface area. Specifically, among those polycrystalline silicon chunks having the above-mentioned particle diameters, it is particularly preferable that the weight of the polycrystalline silicon chunk having a maximum length of 10 mm or more and 45 mm or less is 90% or more when the total weight of the polycrystalline silicon chunks contained in the polycrystalline silicon material is 100%.

Although etching the polycrystalline silicon crushed product can eliminate the effects of surface contamination until the polycrystalline silicon rods are crushed, the surface of the polycrystalline silicon material may again be contaminated with dopant elements due to the storage environment and other factors until the polycrystalline silicon material is used.

Therefore, in order to reduce such surface contamination, as shown in FIG. 1, the polycrystalline silicon material after washing is usually filled in a predetermined amount in a packaging bag made of a resin such as polyethylene, and the packaging bag is sealed. After the polycrystalline silicon material is stored in a sealed state, the packaging bag is transported to a clean room where a silicon single crystal production device has been installed, and the packaging bag is opened, and the polycrystalline silicon material is taken out and filled in a crucible or a recharge tube.

3. DOPANT CONCENTRATION CONTROL OF POLYCRYSTALLINE SILICON MATERIAL

In the present embodiment, the bulk dopant concentrations ($Cd1$ and $Ca1$) and the surface dopant concentrations ($Cd2$ and $Ca2$) in the polycrystalline silicon material are controlled so as to satisfy the above relation.

In the present embodiment, the bulk dopant concentration in the polycrystalline silicon material is a concentration of dopants contained inside the bulk body of the polycrystalline silicon rod after the bulk dopant concentration control, as shown in FIG. 1. The surface dopant concentration in the polycrystalline silicon material is a dopant concentration after the surface dopant concentration control for the polycrystalline silicon crushed product after washing (polycrystalline silicon material), as shown in FIG. 1. After the surface dopant concentration control, by quickly filling the packaging bag with the polycrystalline silicon material and sealing the packaging bag, the surface dopant concentration after the surface dopant concentration control is maintained until the use of the polycrystalline silicon material.

The bulk dopant concentration can be controlled by a purity of the raw material gas during the production of the polycrystalline silicon rod, a purity of the material constituting the electrode, a material of a precipitation reactor, temperature, and the like. The bulk dopant concentration does not change until the polycrystalline silicon material is obtained from the polycrystalline silicon rod. Therefore, by first controlling the bulk dopant concentration to a predetermined value and then performing an operation of controlling the surface dopant concentration, it becomes easy for the bulk dopant concentration and the surface dopant concentration in the polycrystalline silicon material to satisfy the above-mentioned relation.

(3.1. Bulk Dopant Concentration Control of Polycrystalline Silicon Material)

The acceptor elements in silicon are boron (B), aluminum (Al), gallium (Ga), and indium (In). However, since gallium and indium do not substantially present inside the bulk body of the polycrystalline silicon rod, it is not necessary to consider concentrations thereof. Therefore, in the present embodiment, a bulk B concentration and a bulk Al concentration are considered as the bulk acceptor concentration.

The donor elements in silicon are phosphorus (P), arsenic (As), and antimony (Sb). However, since antimony do not substantially present inside the bulk body of the polycrystalline silicon rod, it is not necessary to consider a concentration thereof. Therefore, in the present embodiment, a bulk P concentration and a bulk As concentration are considered as the bulk donor concentration.

The bulk P concentration in the polycrystalline silicon rod can be controlled by, for example, adjusting a concentration of dichlorosilane in trichlorosilane, which is a raw material gas, as described in JP-A-H10-316413. For example, as described in JP-A-2004-250317, JP-A-2005-67979, JP-A-2012-91960, and the like, the bulk P concentration can be controlled by distilling chlorosilanes in the presence of liquid alkoxysilanes, or in the presence of an aldehyde compound having a predetermined structure.

A phosphorus concentration contained in the polycrystalline silicon material can be controlled by the bulk P concentration, but if the bulk P concentration alone does not reach a predetermined phosphorus concentration, a surface P concentration may be controlled by a method described later.

In order to control the bulk B concentration and the bulk Al concentration in the polycrystalline silicon rod, it is necessary to control the purity of trichlorosilane, which is the raw material gas of the polycrystalline silicon rod. However, when the bulk B concentration and the bulk Al concentration are controlled, a bulk carbon (C) concentration and the bulk phosphorus (P) concentration also fluctuate. Therefore, in the present embodiment, the bulk B concentration and the bulk Al concentration are reduced as much as possible, and the acceptor element concentration in the polycrystalline silicon material is controlled by controlling a surface B concentration and a surface Al concentration.

the bulk B concentration, the bulk Al concentration and the bulk As concentration in the polycrystalline silicon rod can be controlled by using purified chlorosilanes obtained by distilling chlorosilanes in the presence of liquid alkoxysilanes or purified chlorosilanes obtained by distilling chlorosilanes in the presence of an aldehyde compound having a predetermined structure, as described in, for example, JP-A-2013-129592, JP-A-2004-250317, JP-A-2005-67979, and JP-A-2012-91960, as with the bulk P concentration.

(3.1.1. Measurement of Bulk Dopant Concentration)

In the present embodiment, the bulk dopant concentration is measured according to JIS H0615. Specifically, a coring rod having an inner diameter of 19 mm in a radial direction and including a silicon core wire is cut out with a drill from any position of a straight body of the polycrystalline silicon rod to obtain a polycrystalline silicon rod for the FZ method. The obtained polycrystalline silicon rod for the FZ method is tapered, degreased and cleaned, and etched with nitrohydrofluoric acid. The etched polycrystalline silicon rod for the FZ method is single-crystallized by the FZ method.

In the obtained single crystal, resistance values in a long axis direction of the single crystal are measured at 10 mm intervals, and an average resistivity is calculated. Next, in the single crystal, a single crystal is cut out from a position showing the same resistivity as the calculated average resistivity. The cut single crystal is polished and then etched with nitrohydrofluoric acid to obtain a sample for photoluminescence (PL) measurement. The bulk dopant concentration of the obtained sample for PL measurement is measured by a PL device in a state where the sample is immersed in liquid helium.

(3.2. Surface Dopant Concentration Control of Polycrystalline Silicon Material)

Then, a method of controlling the concentration of the surface dopant elements will be described. Since the concentration of the surface dopant elements may be controlled by controlling adhesion of the dopant elements to the surface of the polycrystalline silicon material, various methods can be adopted. A method shown below is an example of a method for controlling the concentration of the surface dopant elements, and the concentration of the surface dopant elements may be controlled by a method other than the method shown below.

In the present embodiment, the surface P concentration is considered as a surface donor element, and the surface B concentration and the surface Al concentration are considered as surface acceptor elements. A surface As concentration is not controlled in consideration of worker safety, environmental impact, various laws and regulations, and the like. Since antimony, gallium, and indium are not usually present on the surface of the polycrystalline silicon material, and the surface dopant concentration can be controlled by controlling other dopant elements, surface concentrations of these elements are not considered, as with the bulk concentrations. As described above, adhesion of the dopant elements to the surface of the polycrystalline silicon material is likely to occur when the polycrystalline silicon rod is crushed. The surface dopant elements adhering during such crushing can be easily removed by washing the polycrystalline silicon crushed product. Therefore, in the present embodiment, as shown in FIG. 1, the surface dopant concentration control is performed on the polycrystalline silicon crushed product after washing.

The surface B concentration in the polycrystalline silicon material is proportional to a boron concentration in an atmosphere in contact with the polycrystalline silicon material, an amount of air supplied, and an exposure time. The surface B concentration is inversely proportional to the particle diameter of the polycrystalline silicon chunks constituting the polycrystalline silicon material, and proportional to the surface area of the polycrystalline silicon chunks.

Therefore, in an environment where air having a B concentration of $Q_B$ [ng/m$^3$] is supplied at V [m$^3$/min] to W [kg] of the polycrystalline silicon crushed product after washing (polycrystalline silicon material) having an average particle diameter of L [mm], the surface B concentration $Ca2_B$ [ppta] in the polycrystalline silicon material when the polycrystalline silicon material is exposed to the above environment for t [min] can be expressed by the following equation.

$$Ca2_B = k1 \frac{Q_B V t}{W} \left(\frac{50}{L}\right)^2 \qquad \text{[Math. 1]}$$

"k1" in the equation is a proportional coefficient, and may be calculated by measuring a plurality of samples. The above equation is based on a case where the average particle diameter of the polycrystalline silicon material is 50 mm. Therefore, when the average particle diameter is smaller than 50 mm, the surface B concentration increases, and when the average particle diameter becomes larger than 50 mm, the surface B concentration decreases, even if the exposure condition to the air is the same.

Since the surface B concentration is usually controlled in a clean room, the air supply amount V of the air supplied to the clean room is constant. The B concentration in the air can be measured by a known method, for example, by impinger analysis defined in JACA No. 35A.

The surface Al concentration and the surface P concentration are controlled by using a polyethylene resin, which is a resin constituting the packaging bag filled with the polycrystalline silicon material. For example, JP-A-2017-56959 discloses that in order to keep the surface of the polycrystalline silicon material clean, a concentration of a predetermined dopant element contained in the polyethylene packaging bag used in the storage or transportation of the polycrystalline silicon material is reduced. In contrast, in the present embodiment, by positively utilizing the surface contamination of Al and P from the polyethylene resin, the surface Al concentration and the surface P concentration are controlled to be predetermined values.

The surface Al concentration in the polycrystalline silicon material is proportional to an Al concentration in the polyethylene film and a contact area with the polyethylene film per unit weight of the polycrystalline silicon material. The surface P concentration in the polycrystalline silicon material is proportional to an amount of phosphoric acid ester in the polyethylene film and a contact area with the polyethylene film per unit weight of the polycrystalline silicon material.

Therefore, in the present embodiment, the polycrystalline silicon material is brought into contact with the polyethylene film in a clean room environment for controlling the surface B concentration. In this case, in order to prevent the surface of the polycrystalline silicon material from being contaminated by elements other than Al and P, it is preferable to cover a bottom surface and side surfaces of the polycrystalline silicon material with the polyethylene film as a protective covering.

The present inventors have found that with respect to the surface Al concentration and the surface P concentration, the influence of the average particle diameter of the polycrystalline silicon material and a contact time with the polyethylene film can be ignored.

The polyethylene resin often contains catalyst-derived Al components such as organoaluminum, aluminoxane, and aluminum chloride. When the polycrystalline silicon material comes into contact with the polyethylene resin, Al contained in the polyethylene resin adheres to the surface of the polycrystalline silicon material.

Since a content of Al contained in the polyethylene resin depends on polyethylene pellets as a raw material, a concentration of Al contained in the polyethylene resin can be controlled. Therefore, assuming that a contact area between the polyethylene film and the polycrystalline silicon material when the polycrystalline silicon material W [kg] is placed on the polyethylene film having an Al concentration of $Q_{\_Al}$ [ng/cm$^2$] is S [cm$^2$], the surface Al concentration $Ca2_{\_Al}$ [pptw] in the polycrystalline silicon material can be expressed by the following equation.

$$Ca2_{\_Al} = k2 Q_{\_Al} \frac{S}{W} \quad \text{[Math. 2]}$$

"k2" in the equation is a proportional coefficient, and may be calculated by measuring a plurality of samples. The Al concentration $Q_{\_Al}$ [ng/cm$^2$] in the polyethylene film is obtained by heat-sealing the polyethylene film into a bag shape so that a surface in contact with the polycrystalline silicon material becomes the inside, adding a dilute acid such as hydrochloric acid and nitric acid to extract polyethylene, and then performing quantification by ICP-MS. The contact area S corresponds to an area of the polyethylene film when the polycrystalline silicon material is placed on a planar polyethylene film without gaps.

Phosphoric acid esters are added as additives to the polyethylene resin for applications such as plasticizers and antioxidants. When the polycrystalline silicon material comes into contact with the polyethylene resin, phosphorus generated by the phosphoric acid esters adheres to the surface of the polycrystalline silicon material. Since an amount of phosphorus in the polyethylene resin depends on an amount of the phosphoric acid esters, the amount of phosphorus contained in the polyethylene resin can be controlled.

Therefore, assuming that the contact area between the polyethylene film and the polycrystalline silicon material is S [cm$^2$] when a polycrystalline silicon material $W_3$ [kg] is placed on the polyethylene film in which a phosphoric acid ester $W_2$ [kg] is added to polyethylene pellets $W_1$ [kg], the surface P concentration ($Ca2_{\_P}$) [ppta] in the polycrystalline silicon material can be expressed by the following equation.

$$Ca2_{\_P} = k3 \frac{W_2}{W_1} \frac{S}{W_3} \quad \text{[Math. 3]}$$

"k3" in the equation is a proportional coefficient, and may be calculated by measuring a plurality of samples. The contact area S corresponds to the area of the polyethylene film when the polycrystalline silicon material is placed on a planar polyethylene film without gaps.

As described above, after controlling the surface dopant concentration, polycrystalline silicon material is quickly filled in a packaging bag that is substantially free of Al and P and the packaging bag is sealed, so that the surface dopant concentration after the surface dopant concentration control is maintained until the polycrystalline silicon material is used. Examples of the packaging bag substantially free of Al and P include a packaging bag made of low-density polyethylene (LDPE) that does not contain phosphoric acid esters as a plasticizer or an antioxidant, and the like. This is because LDPE can be synthesized by radical polymerization without using a catalyst containing an Al component.

(3.2.1. Measurement of Surface Dopant Concentration)

The surface B concentration, the surface Al concentration, and the surface P concentration in the polycrystalline silicon material after controlling the surface dopant concentration by the above method can be measured by the method shown below.

First, in order to increase a lower limit of quantification, a complex-forming agent for preventing volatilization of boron is dissolved in a nitrohydrofluoric acid solution containing high-purity nitric acid and high-purity hydrofluoric acid. Examples of the complex-forming agent include higher alcohols.

A predetermined amount of a polycrystalline silicon chunk is immersed in the nitrohydrofluoric acid solution, and a surface layer portion is eluted by etching over a depth of 1 m or more, preferably 20 μm to 30 μm, and then the polycrystalline silicon chunk is taken out. Then, after evaporating the nitrohydrofluoric acid solution containing an eluate to dryness at 100° C. or higher, and a residue is recovered by dissolving it with high-purity nitric acid. The surface B concentration, the surface Al concentration, and the surface P concentration may be calculated by using measured values obtained by quantifying the recovered residue by a double-focusing ICP-MS.

The surface As concentration can be measured by a method shown below. For example, as described in JP-A-2005-172512, after filling a predetermined amount of a polycrystalline silicon chunk into a fluororesin container whose lid is provided with an outlet for collecting impurity gas, a predetermined amount of high-purity hydrofluoric acid is added through the outlet to immerse the polycrystalline silicon chunks with the high-purity hydrofluoric acid and then the container is sealed. After removing a natural oxide film as a surface layer, generated gas containing arsenic is collected from the outlet. The surface As concentration may be calculated by using measured values obtained by quantifying the collected gas using a double-focusing ICP-MS equipped with a gas sample introduction system.

The surface B concentration, the surface Al concentration, the surface P concentration, and the surface As concentration are calculated according to the following equation using measured values of concentrations of dopant elements quantified using the double-focusing ICP-MS.

$$Q = \frac{(C - C_b)}{W} L \frac{M_{Si}}{M} \qquad [\text{Math. 4}]$$

Q: concentration [ppta] of each surface dopant element
C: measured value [ng/L]
Cb: operation blank value [ng/L]
W: weight [g] of polycrystalline silicon sample
L: nitric acid amount [L] used to recover residue
$M_{Si}$: atomic weight of silicon
M: atomic weight of target dopant (B, Al, P, As)

The surface dopant concentrations (Ca2 and Cd2) [ppta] can be obtained from the surface B concentration, the surface Al concentration, the surface P concentration, and the surface As concentration obtained as described above.

4. SUMMARY OF EMBODIMENT

In the present embodiment, attention is paid to a fact that the total concentration of the bulk dopant elements present in the silicon single crystal largely depends on the total concentration of all dopant elements present in the polycrystalline silicon material used to produce the silicon single crystal.

The conduction type of the silicon single crystal is determined by whether the free electrons or the positive holes are the majority carriers. The resistivity of the silicon single crystal corresponds to the difference between the number of the majority carriers and the number of minority carriers.

Therefore, in the polycrystalline silicon material used for producing the silicon single crystal, a bulk concentration and a surface concentration of the acceptor elements and a bulk concentration and a surface concentration of the donor elements in the polycrystalline silicon material are controlled so as to satisfy the above-mentioned relation.

As a method for producing the silicon single crystal, for example, as shown in FIG. 1, a method for producing a silicon single crystal ingot using the above-mentioned polycrystalline silicon material is exemplified. A CZ method is preferable as a method for obtaining the silicon single crystal ingot. In the CZ method, the polycrystalline silicon material contained in a crucible is heated to form a silicon melt, and the silicon single crystal ingot obtained by bringing a seed crystal into contact with the silicon melt is grown while being pulled up.

The obtained silicon single crystal ingot is usually in a rod shape and often consists of a stably crystal-grown straight body having a constant diameter, and a top portion (diameter expansion portion) and a tail portion (diameter reduction portion) located at both ends of the straight body. A length of the straight body of the silicon single crystal ingot produced by the CZ method is usually 900 mm to 1800 mm, and a diameter thereof is usually 200 mm to 300 mm.

Dopants may be added when the polycrystalline silicon material is melted to control the resistivity and the like. However, by using the polycrystalline silicon material according to the present embodiment, a silicon single crystal ingot having high resistivity can be obtained without adding any dopant when the polycrystalline silicon material is melted. Note that, in a case of producing the silicon single crystal using the polycrystalline silicon material according to the present embodiment, a dopant may also be added when the polycrystalline silicon material is melt in order to control characteristics of the silicon single crystal.

In the polycrystalline silicon material, since the effective acceptor element concentration (the difference between the sum of the bulk concentration and the surface concentration of the acceptor elements and the sum of the bulk concentration and the surface concentration of the donor elements) satisfies the above-mentioned relation, the conduction type of the obtained silicon single crystal ingot is P-type, and the resistivity shows a value corresponding to the effective acceptor element concentration of the polycrystalline silicon material.

In the present embodiment, since the concentrations of all the acceptor elements and the donor elements that affect the conduction type of the silicon single crystal ingot are taken into consideration, an ingot having a desired conduction type can be obtained, and an ingot having a conduction type different from the desired conduction type cannot be obtained.

Since the value calculated from the above-mentioned relation in the polycrystalline silicon material corresponds to the resistivity in the silicon single crystal ingot, the desired resistivity can be accurately achieved.

Although the embodiment of the present invention has been described above, the present invention is not limited to the above-mentioned embodiment, and may be modified in various modes within the scope of the present invention.

EXAMPLES

The present invention will be described below in more detail with reference to Examples. However, the present invention is not limited to the following Examples.

Example 1

The polycrystalline silicon material was produced by the Siemens method. As the raw material gas, high-purity purified trichlorosilane and hydrogen were used.

Purified trichlorosilane produced by the method shown below was used. First, low-purity crude trichlorosilane was obtained by a reaction of metallurgical low-purity silicon called metallic silicon with hydrogen chloride and a reaction of the metallic silicon with tetrachlorosilane and hydrogen.

B, Al, P, and As were included in the metallic silicon being a raw material of the crude trichlorosilane at ratios of several hundred ppb to several hundred ppm. During the reaction of the metallic silicon with hydrogen chloride and the reaction of the metallic silicon with tetrachlorosilane and hydrogen, each dopant component was chlorinated and get into the crude trichlorosilane.

Therefore, the obtained crude trichlorosilane was distilled and purified to separate and remove B, P, Al, and As in the crude trichlorosilane to obtain the purified trichlorosilane. As a result of measuring impurity concentrations in the obtained purified trichlorosilane by ICP-MS, the B, P, Al, and As concentrations were each 1 [ppba] or less.

In a precipitating step of the polycrystalline silicon, the purified trichlorosilane was supplied to a reaction vessel, and the unreacted trichlorosilane was recovered, distilled and purified, and then supplied again into the reaction vessel. In a recovery and purification step of trichlorosilane, dichlorosilane and $SiH_3PH_3$ having a boiling point close to that of dichlorosilane were released to the outside of the system to reduce the P concentration in the recovered purified trichlorosilane.

The B, P, Al, and As concentrations in the recovered purified trichlorosilane were measured by ICP-MS and, as a result, each were found to be 1 [ppba] or less, and a dichlorosilane concentration was measured by gas chromatography and, as a result, was found to be 800 [ppmw].

As hydrogen, high-purity hydrogen having a dew point of −70° C. or lower and recovered purified hydrogen obtained by purifying unreacted hydrogen recovered after supplying the high-purity hydrogen to the reaction vessel were used. The high-purity hydrogen and the recovered purified hydrogen were mixed, and amounts of dopant components in hydrogen immediately before the mixed hydrogen was supplied into the reaction vessel were measured by the impinger method. As a result, the B, Al, P, and As were all equal to or less than the lower limit of quantification of 0.05 [ppbv].

The silicon core wire on which the polycrystalline silicon precipitates was cut out from the polycrystalline silicon rod, and then the surface layer was eluted with a depth of 5 μm or more by etching with nitrohydrofluoric acid, so that the influence of heavy metal contamination and dopant contamination received during cutting out was eliminated.

After the silicon core wire was energized and heated to approximately 1000° C., a mixed gas of the above-mentioned purified trichlorosilane and high-purity hydrogen was supplied into the reaction vessel to precipitate the polycrystalline silicon. When a diameter of the precipitated polycrystalline silicon was approximately 130 mm, the supply of the mixed gas of the purified trichlorosilane and the high-purity hydrogen and the supply of the electric power were terminated, and the precipitation reaction was terminated. Subsequently, a precipitate of the polycrystalline silicon was cut out to obtain a polycrystalline silicon rod.

The bulk dopant concentration of the obtained polycrystalline silicon rod was measured as follows. According to JIS H0615, the obtained polycrystalline silicon rod was cored so as to pass through a silicon core wire portion, and a coring rod having a diameter of 19 mm was obtained. The obtained coring rod was etched with nitrohydrofluoric acid to eliminate contamination during coring, and then single-crystallized by the FZ method. In a long axis direction of the obtained single crystal, a specific resistance value was measured every 10 mm with a four-point probe resistance measuring device (RT-80 manufactured by NAPSON), and the average resistivity was calculated. The obtained average resistivity was 2,200 [Ωcm].

Subsequently, a photoluminescence sample was cut out from a position showing a resistivity of 2,200 [Ωcm], polished, and etched to obtain a mirror surface sample. The obtained mirror surface sample was immersed in liquid helium, and the amount of each dopant was measured with a photoluminescence measuring device (PL-82IGA manufactured by Seishin Trading Co., Ltd.). As a result, the bulk B concentration was 2 [ppta], the bulk Al concentration was less than 1 [ppta], which was the lower limit of quantification, the bulk P concentration was 45 [ppta], and the bulk As concentration was 1 [ppta]. Therefore, the bulk acceptor concentration was 2 [ppta] and the bulk donor concentration was 46 [ppta]. Since the measurement result of the bulk Al concentration was less than 1 [ppta] and no peak was confirmed, the bulk Al concentration was set to 0 [ppta] and the bulk acceptor concentration was calculated.

The remaining polycrystalline silicon rod after obtaining the sample for bulk dopant concentration measurement was crushed to obtain the polycrystalline silicon crushed product (polycrystalline silicon nuggets).

The obtained polycrystalline silicon nuggets were sorted into three sizes by a sorting device, 30 kg of each sorted nugget was taken out, and a maximum length was measured with a caliper for each piece.

Small size nuggets S contained 93 wt % of nuggets having a maximum length of 10 mm or more and 45 mm or less, and a median diameter of the nuggets S was 31 mm.

Middle size nuggets M contained 92 wt % of nuggets having a maximum length of 20 mm or more and 70 mm or less, and a median diameter of the nuggets M was 51 mm.

Large size nuggets L contained 92 wt % of nuggets having a maximum length of 60 mm or more and 100 mm or less, and a median diameter of the nuggets L was 83 mm.

The polycrystalline silicon nuggets selected according to size were etched with a mixed acid of nitric acid for electronics industry and hydrofluoric acid for electronics industry to elute a surface layer portion, and surface contamination during crushing was eliminated. Since reactivity of the nuggets to the etching solution was different depending on the size of the nuggets, an etching time was adjusted according to the size of the nuggets so that an etch-off amount was 3 m or more for any size of nuggets. Then, rinsing was performed with ultrapure water having a specific resistance of 18 MΩcm to obtain three types of polycrystalline silicon materials having different sizes. The bulk dopant concentrations of the three types of polycrystalline silicon materials were the same.

The surface dopant concentration of the obtained polycrystalline silicon materials was controlled as follows.

First, the polycrystalline silicon materials were transported to a clean room whose cleanliness was controlled by ISO14644-1 Class 6, placed in a container covered with a polyethylene sheet for each size, and air-dried.

For the polycrystalline silicon materials of all sizes, 150 kg of polycrystalline silicon was placed in the container, and a contact area between the polycrystalline silicon material and the polyethylene sheet in that case was 1.7 $m^2$. An amount of air supplied to the polycrystalline silicon material during air drying was 40 $m^3$/min.

As a result of measuring dopant concentrations in the supplied air according to a standard (JACA No. 35A) defined by the Japan Air Cleaning Association, the B concentration was 31 ng/$m^3$, and the Al concentration, the P concentration, and the As concentration were all equal to or less than 1 ng/$cm^3$, which was the lower limit of quantification.

As the polyethylene sheet for protective covering, a linear short-chain branched polyethylene (LLDPE) sheet not containing phosphoric acid esters as an antioxidant was used. This polyethylene sheet was immersed in a 5% dilute nitric acid aqueous solution and amounts of dopants on a surface of the polyethylene sheet were investigated by ICP-MS. As a result, the Al concentration was 13 ng/$cm^2$, and the B concentration, the P concentration, and the As concentration were all 1 ng/$cm^2$, which was the lower limit of quantification.

In order to control the surface dopant concentration, an air-drying time was set to 6 hours for the nuggets S, 15 hours for the nuggets M, and 36 hours for the nuggets L. After the air drying was completed, 5 kg of each size was packed in a polyethylene packaging bag, and an opening of the packaging bag was sealed with a heat seal. The polyethylene packaging bag was filled with a 5% dilute nitric acid aqueous solution, and an extract was measured by ICP-MS to investigate amounts of dopants on a contact surface of the packaging bag with the nuggets. As a result, the B concentration, the Al concentration, the P concentration, and the As concentration were all 1 ng/cm², which was the lower limit of quantification.

As a sample for measuring the surface dopant concentration, 5 kg of the polycrystalline silicon nuggets were extracted from the sealed polyethylene packaging bag for each size. The surface dopant concentration was measured as follows.

After mannitol was added to high-purity nitric acid and high-purity hydrofluoric acid for dissolution, approximately 100 g of the polycrystalline silicon nuggets were taken out of the bag with PFA tweezers and immersed in nitrohydrofluoric acid. After dissolving 20 μm to 30 μm of surfaces of the nuggets, the polycrystalline silicon nuggets were taken out from the nitrohydrofluoric acid.

After taking out the polycrystalline silicon, the nitrohydrofluoric acid was heated to be evaporated to dryness, and then a residue was recovered and dissolved in 10 ml of nitric acid, and each surface dopant element was quantified by a double-focusing ICP-MS (Element 2 manufactured by Thermo Fischer). From the obtained measured values, the concentration of each surface dopant element based on the number of silicon contained in the polycrystalline silicon was calculated using the equation shown below. Results are shown in Table 1.

$$Q = \frac{(C - C_b)}{W} L \frac{M_{Si}}{M} \quad [\text{Math. 5}]$$

Q: concentration [ppta] of each surface dopant element
C: measured value [ng/L]
Cb: operation blank value [ng/L]
W: weight [g] of polycrystalline silicon sample
L: nitric acid amount [L] used to recover residue
$M_{Si}$: atomic weight of silicon
M: atomic weight of target dopant (B, Al, P, As)

For the surface As concentration, approximately 100 g of the polycrystalline silicon nuggets were filled in a fluororesin container including an outlet for collecting impurity gas on a lid, and then 200 mL of high-purity hydrofluoric acid was poured from the outlet to immerse the polycrystalline silicon nuggets. A measured value was obtained by quantifying a gas containing an As component generated by this operation with a double-focusing ICP-MS equipped with a gas sample introduction system (manufactured by J-Science).

TABLE 1

| | Surface dopant concentration | | | | | |
|---|---|---|---|---|---|---|
| | Surface donor concentration [ppta] | | Surface acceptor concentration [ppta] | | Cd2 | Ca2 |
| Sample | P | As | B | Al | [ppta] | [ppta] |
| Nuggets S | 28 | <1 | 70 | 16 | 28 | 86 |
| Nuggets M | 27 | <1 | 76 | 12 | 27 | 88 |
| Nuggets L | 26 | <1 | 72 | 14 | 26 | 86 |

Silicon single crystal was grown by the CZ method using the obtained polycrystalline silicon nuggets.

In order to prevent contamination when filling a quartz crucible with the polycrystalline silicon, after performing an outside air treatment with an air washer, air that has passed through a low boron glass fiber HEPA filter was supplied to the clean room, and the dopant concentration in the air was measured by the impinger method. As a result, the B concentration was 2 ng/m³, and the Al concentration, the P concentration, and the As concentration were all 1 ng/m³ or less, which was the lower limit of quantification.

The sealed polyethylene packaging bag was opened in the clean room whose cleanliness is controlled by ISO14644-1 Class 6, the quartz crucible was filled with 150 kg of the polycrystalline silicon nuggets, and then silicon single crystal having a straight body length of 1600 mm and a diameter of 200 mm was obtained by the CZ method.

The specific resistance values between the top side (solidification rate: 0.05) and the tail side (solidification rate: 0.84) of the straight body of the obtained silicon single crystal were measured with the four-ended needle resistance measuring device, as a result, the results shown in Table 2 were obtained.

TABLE 2

| | Polycrystalline silicon material | | | | | | Silicon single crystal | | | |
|---|---|---|---|---|---|---|---|---|---|---|
| | Raw | | | | | | Top side | | Tail side | |
| Sample No. | material used | Dopant concentration [ppta] | | | | | Conduction type | Resistivity [Ωcm] | Conduction type | Resistivity [Ωcm] |
| | | Cd1 | Cd2 | Ca1 | Ca2 | C* | | | | |
| 1 | Nuggets S | 46 | 28 | 2 | 86 | 14 | P | 18800 | P | 17900 |
| 2 | Nuggets M | 46 | 27 | 2 | 88 | 17 | P | 13800 | P | 13000 |
| 3 | Nuggets L | 46 | 26 | 2 | 86 | 16 | P | 15900 | P | 15200 |

C* = (Ca1 + Ca2) − (Cd1 + Cd2)

It was confirmed from Table 2 that, by controlling the bulk dopant concentration and the surface dopant concentration in the polycrystalline silicon material to satisfy the above relation, the silicon single crystal having a desired conduction type of p-type can be obtained.

In addition, it was confirmed that a magnitude relation among resistivities of Sample Nos. 1 to 3 corresponds to a magnitude relation among effective acceptor element concentrations (C*) of polycrystalline silicon materials used for producing Sample Nos. 1 to 3. Therefore, by setting the effective acceptor element concentration of the polycrystalline silicon material to a predetermined value, the desired resistivity can be accurately achieved.

Example 2

The synthesis, distillation and purification, recovery and purification of trichlorosilane, and the precipitation of polycrystalline silicon were carried out in a similar manner to Example 1. The concentration of dichlorosilane in the recovered purified trichlorosilane in this case was measured by gas chromatography and, as a result, was found to be 900 ppmw.

The polycrystalline silicon obtained after the precipitation was analyzed by the same method as in Example 1. The average resistivity was 1,700 [Ωcm]. The bulk B concentration was 2 [ppta], and the bulk Al concentration was less than 1 [ppta], which was the lower limit of quantification. The bulk acceptor concentration was set to 2 [ppta], regarding the bulk Al concentration as 0 [ppta]. The bulk P concentration was 51 [ppta] and the bulk As concentration was 3 [ppta]. Therefore, the bulk donor concentration was 54 [ppta].

Subsequently, in the same manner as in Example 1, the obtained polycrystalline silicon rod was crushed, sorted into nuggets S, nuggets M, and nuggets L, and then etched to obtain the polycrystalline silicon material.

30 kg of each size of nuggets was extracted and the maximum length is measured for each piece. As a result, the nuggets S contained 91 wt % of the nuggets having a maximum length of 10 mm or more and 45 mm or less, and the median diameter of the nuggets S was 29 mm. The nuggets M contained 94 wt % of the nuggets having a maximum length of 20 mm or more and 70 mm or less, and the median diameter of the nuggets M was 51 mm The nuggets L contained 94 wt % of the nuggets having a maximum length of 60 mm or more and 100 mm or less, and the median diameter of the nuggets L was 81 mm.

The polycrystalline silicon material obtained by etching was placed in the container on which the polyethylene sheet was covered for each size and air-dried, in the same manner as in Example 1. In this case, the weight of the polycrystalline silicon material placed in the container was 150 kg for each size. The contact area between the polycrystalline silicon material and the polyethylene sheet was 1.7 m². The amount of air supplied to the polycrystalline silicon material during the air drying was 40 m³/min. The dopant concentration in the supplied air was measured. As a result, the B concentration was 57 ng/m³, and the Al concentration, the P concentration, and the As concentration were all equal to or less than 1 ng/m³, which was the lower limit of quantification.

As the polyethylene sheet for protective covering, the LLDPE sheet containing phosphoric acid esters was used. the amounts of dopants on the surface of this sheet were measured. As a result, the P concentration was 15 ng/cm², the Al concentration was 4 ng/cm², and the B concentration and As concentration were both 1 ng/cm², which was the lower limit of quantification.

The air-drying time of the nuggets was 3 hours for the nugget S, 7 hours for the nuggets M, and 18 hours for the nuggets L. After the air drying, 5 kg of each size was packed in the polyethylene packaging bag, and the opening of the packaging bag was sealed with heat seal.

5 kg of the polycrystalline silicon nuggets were extracted for each size from the sealed polyethylene packaging bag, and each surface dopant concentration was calculated in the same manner as in Example 1. Results are shown in Table 3.

TABLE 3

| | Surface dopant concentration | | | | | |
|---|---|---|---|---|---|---|
| | Surface donor concentration [ppta] | | Surface acceptor concentration [ppta] | | Cd2 | Ca2 |
| Sample | P | As | B | Al | [ppta] | [ppta] |
| Nuggets S | 11 | <1 | 65 | 5 | 11 | 70 |
| Nuggets M | 12 | <1 | 66 | 4 | 12 | 70 |
| Nuggets L | 11 | <1 | 65 | 3 | 11 | 68 |

Using the obtained polycrystalline silicon nugget, silicon single crystal having a straight body length of 1600 mm and a diameter of 200 mm was obtained by the CZ method in the same manner as in Example 1.

In the same manner as in Example 1, the conduction type and the specific resistance value of the obtained silicon single crystal were measured. Results are shown in Table 4.

TABLE 4

| | Polycrystalline silicon material | | | | | Silicon single crystal | | | |
|---|---|---|---|---|---|---|---|---|---|
| | Raw | | | | | Top side | | Tail side | |
| Sample No. | material used | Dopant concentration [ppta] | | | | Conduction type | Resistivity [Ωcm] | Conduction type | Resistivity [Ωcm] |
| | | Cd1 | Cd2 | Ca1 | Ca2 | C* | | | |
| 4 | Nuggets S | 54 | 11 | 2 | 70 | 7 | P | 29200 | P | 27800 |
| 5 | Nuggets M | 54 | 12 | 2 | 70 | 6 | P | 35100 | P | 33300 |
| 6 | Nuggets L | 54 | 11 | 2 | 68 | 5 | P | 42300 | P | 40400 |

C* = (Ca1 + Ca2) − (Cd1 + Cd2)

It was confirmed from Table 4 that, by controlling the relation between the bulk dopant concentration and the surface dopant concentration in the polycrystalline silicon material within the above range, silicon single crystal having a desired conduction type and a desired resistivity can be obtained, as with Example 1.

Example 3

The synthesis, distillation and purification, recovery and purification of trichlorosilane, and the precipitation of polycrystalline silicon were carried out in a similar manner to Example 1. The concentration of dichlorosilane in the recovered purified trichlorosilane in this case was measured by gas chromatography and, as a result, was found to be 200 ppmw.

The polycrystalline silicon obtained after the precipitation was analyzed by the same method as in Example 1. The average resistivity was 8,300 [Ωcm]. The bulk B concentration was 2 [ppta], and the bulk Al concentration was less than 1 [ppta], which was the lower limit of quantification. The bulk acceptor concentration was set to 2 [ppta], regarding the bulk Al concentration as 0 [ppta]. The bulk P concentration was 11 [ppta] and the bulk As concentration was 2 [ppta]. Therefore, the bulk donor concentration was 13 [ppta].

Subsequently, in the same manner as in Example 1, the obtained polycrystalline silicon rod was crushed, sorted into nuggets S, nuggets M, and nuggets L, and then etched to obtain the polycrystalline silicon material.

30 kg of each size of the nuggets is extracted and the maximum length was measured for each piece. As a result, the nuggets S contained 92 wt % of the nuggets having a maximum length of 10 mm or more and 45 mm or less, and the median diameter of the nuggets S was 31 mm. The nuggets M contained 93 wt % of the nuggets having a maximum length of 20 mm or more and 70 mm or less, and the median diameter of the nuggets M was 50 mm. The nuggets L contained 92 wt % of the nuggets having a maximum length of 60 mm or more and 100 mm or less, and the median diameter of the nuggets L was 81 mm.

The polycrystalline silicon material obtained by etching was placed in the container on which the polyethylene sheet was covered for each size, and air-dried, in the same manner as in Example 1. In this case, the weight of the polycrystalline silicon material placed in the container was 150 kg for each size. The contact area between the polycrystalline silicon material and the polyethylene sheet was 1.7 m². The amount of air supplied to the polycrystalline silicon material during the air drying was 40 m³/min. the dopant concentration in the supplied air is measured. As a result, the B concentration was 30 ng/m³, and the Al concentration, the P concentration, and the As concentration were all equal to or less than 1 ng/m³, which was the lower limit of quantification.

As the polyethylene sheet for protective covering, the LDPE sheet not containing phosphoric acid esters was used. the amounts of dopants on the surface of this sheet were measured. As a result, the Al concentration was 2 ng/cm², the B concentration, the P concentration, and the As concentration were all 1 ng/cm², which was the lower limit of quantification.

The air-drying time of the nuggets was 3 hours for the nugget S, 7 hours for the nuggets M, and 18 hours for the nuggets L. After the air drying, 5 kg of each size was packed in the polyethylene packaging bag, and the opening of the packaging bag was sealed with heat seal. 5 kg of the polycrystalline silicon nuggets were extracted for each size from the sealed polyethylene packaging bag, and each surface dopant concentration was calculated in the same manner as in Example 1. Results are shown in Table 5.

TABLE 5

| | Surface dopant concentration | | | | Cd2 | Ca2 |
|---|---|---|---|---|---|---|
| | Surface donor concentration [ppta] | | Surface acceptor concentration [ppta] | | [ppta] | [ppta] |
| Sample | P | As | B | Al | | |
| Nuggets S | 1 | <1 | 34 | 1 | 1 | 35 |
| Nuggets M | 1 | <1 | 32 | 1 | 1 | 33 |
| Nuggets L | 1 | <1 | 35 | 1 | 1 | 36 |

Using the obtained polycrystalline silicon nugget, silicon single crystal having a straight body length of 1600 mm and a diameter of 200 mm was obtained by the CZ method in the same manner as in Example 1.

In the same manner as in Example 1, the conduction type and the specific resistance value of the obtained silicon single crystal were measured. Results are shown in Table 6.

TABLE 6

| | Polycrystalline silicon material | | | | | | Silicon single crystal | | | |
|---|---|---|---|---|---|---|---|---|---|---|
| | Raw | | | | | | Top side | | Tail side | |
| Sample No. | material used | Dopant concentration [ppta] | | | | | Conduction type | Resistivity [Ωcm] | Conduction type | Resistivity [Ωcm] |
| | | Cd1 | Cd2 | Ca1 | Ca2 | C* | | | | |
| 7 | Nuggets S | 13 | 1 | 2 | 35 | 23 | P | 11200 | P | 10700 |
| 8 | Nuggets M | 13 | 1 | 2 | 33 | 21 | P | 11400 | P | 10900 |
| 9 | Nuggets L | 13 | 1 | 2 | 36 | 24 | P | 10700 | P | 10200 |

C* = (Ca1 + Ca2) − (Cd1 + Cd2)

It was confirmed from Table 6 that, by controlling the relation between the bulk dopant concentration and the surface dopant concentration in the polycrystalline silicon material within the above range, silicon single crystal having a desired conduction type and a desired resistivity can be obtained, as with Example 1.

Comparative Example 1

The synthesis, distillation and purification, recovery and purification of trichlorosilane, and the precipitation of polycrystalline silicon were carried out in a similar manner to Example 1. The concentration of dichlorosilane in the recovered purified trichlorosilane in this case was measured by gas chromatography and, as a result, was found to be 150 ppmw.

The polycrystalline silicon obtained after the precipitation was analyzed by the same method as in Example 1. The average resistivity was 10,100 [Ωcm]. The bulk B concentration was 2 [ppta], and the bulk Al concentration was less than 1 [ppta], which was the lower limit of quantification. The bulk acceptor concentration was set to 2 [ppta], regarding the bulk Al concentration as 0 [ppta]. The bulk P concentration was 9 [ppta] and the bulk As concentration was 1 [ppta]. Therefore, the bulk donor concentration was 10 [ppta].

Subsequently, in the same manner as in Example 1, the obtained polycrystalline silicon rod was crushed, sorted into nuggets S, nuggets M, and nuggets L, and then etched to obtain the polycrystalline silicon material.

30 kg of each size of nuggets was extracted and the maximum length was measured for each piece, the nuggets S contained 92 wt % of the nuggets having a maximum length of 10 mm or more and 45 mm or less, and the median diameter of the nuggets S was 30 mm. The nuggets M contained 92 wt % of the nuggets having a maximum length of 20 mm or more and 70 mm or less, and the median diameter of the nuggets M was 49 mm. The nuggets L contained 94 wt % of the nuggets having a maximum length of 60 mm or more and 100 mm or less, and the median diameter of the nuggets L was 81 mm.

The polycrystalline silicon material obtained by etching was placed in the container on which the polyethylene sheet was covered for each size, and air-dried, in the same manner as in Example 1. In this case, the weight of the polycrystalline silicon material placed in the container was 150 kg for each size. The contact area between the polycrystalline silicon material and the polyethylene sheet was 1.7 m². The amount of air supplied to the polycrystalline silicon material during the air drying was 40 m³/min. The dopant concentration in the supplied air was measured. As a result, the B concentration was 14 ng/m³, and the Al concentration, the P concentration, and the As concentration were all equal to or less than 1 ng/m³, which was the lower limit of quantification.

As the polyethylene sheet for protective covering, the LDPE sheet not containing phosphoric acid esters was used. the amounts of dopants on the surface of this sheet were measured. As a result, the Al concentration was 2 ng/cm², the B concentration, the P concentration, and the As concentration were all 1 ng/cm², which was the lower limit of quantification.

Similar to Example 1, the air-drying time of the nuggets was 2 hours for the nugget S, 4 hours for the nuggets M, and 12 hours for the nuggets L. After the air drying, 5 kg of each size was packed in the polyethylene packaging bag, and the opening of the packaging bag was sealed with heat seal.

5 kg of the polycrystalline silicon nuggets were extracted for each size from the sealed polyethylene packaging bag, and each surface dopant concentration was calculated in the same manner as in Example 1. Results are shown in Table 7.

TABLE 7

| | Surface dopant concentration | | | | | |
|---|---|---|---|---|---|---|
| | Surface donor concentration [ppta] | | Surface acceptor concentration [ppta] | | Cd2 | Ca2 |
| Sample | P | As | B | Al | [ppta] | [ppta] |
| Nuggets S | 1 | <1 | 12 | 1 | 1 | 13 |
| Nuggets M | 1 | <1 | 9 | 1 | 1 | 10 |
| Nuggets L | 1 | <1 | 11 | <1 | 1 | 11 |

Using the obtained polycrystalline silicon nugget, silicon single crystal having a straight body length of 1600 mm and a diameter of 200 mm was obtained by the CZ method in the same manner as in Example 1.

In the same manner as in Example 1, the conduction type and the specific resistance value of the obtained single crystal silicon were measured. Results are shown in Table 8.

TABLE 8

| | Polycrystalline silicon material | | | | | Silicon single crystal | | | |
|---|---|---|---|---|---|---|---|---|---|
| | Raw | | | | | Top side | | Tail side | |
| Sample No. | material used | Dopant concentration [ppta] | | | | Conduction type | Resistivity [Ωcm] | Conduction type | Resistivity [Ωcm] |
| | | Cd1 | Cd2 | Ca1 | Ca2 | C* | | | |
| 10 | Nuggets S | 10 | 1 | 2 | 13 | 4 | N | 63000 | P | 65700 |
| 11 | Nuggets M | 10 | 1 | 2 | 10 | 1 | N | 32500 | P | 86800 |
| 12 | Nuggets L | 10 | 1 | 2 | 11 | 2 | N | 46000 | P | 75300 |

C* = (Ca1 + Ca2) − (Cd1 + Cd2)

From Table 8, unlike Examples 1 to 3, in the silicon single crystal ingots of Sample Nos. 10 to 12, the conduction type on the top side was n-type opposite to a desired conduction type, and was inverted to p-type in the middle of the ingots.

Therefore, it was confirmed that even if both the bulk dopant concentration and the surface dopant concentration are lowered to minimize contamination of the polycrystalline silicon material, if the relation between the bulk dopant concentration and the surface dopant concentration is not controlled within a predetermined range, the conduction type is inverted in the middle of the silicon single crystal ingot. As a result, it was confirmed that a yield of the silicon single crystal is greatly reduced.

A straight body length at a position where the conduction type was P-type and the resistivity was 10,000 [Ωcm] or more was 600 mm in Sample No. 10, 150 mm in Sample No. 11, and 300 mm in Sample No. 12.

Comparative Example 2

The synthesis, distillation and purification, recovery and purification of trichlorosilane, and the precipitation of polycrystalline silicon were carried out in a similar manner to Example 1. The concentration of dichlorosilane in the recovered purified trichlorosilane in this case was measured by gas chromatography and, as a result, was found to be 200 ppmw.

The polycrystalline silicon obtained after the precipitation was analyzed by the same method as in Example 1. The average resistivity was 7,600 [Ωcm]. The bulk B concentration was 3 [ppta], and the bulk Al concentration was less than 1 [ppta], which was the lower limit of quantification. The bulk acceptor concentration was set to 3 [ppta], regarding the bulk Al concentration as 0 [ppta]. The bulk P concentration was 12 [ppta] and the bulk As concentration was 1 [ppta]. Therefore, the bulk donor concentration was 13 [ppta].

Subsequently, in the same manner as in Example 1, the obtained polycrystalline silicon rod was crushed, sorted into nuggets S, nuggets M, and nuggets L, and then etched to obtain the polycrystalline silicon material.

30 kg of each size of nuggets was extracted and the maximum length was measured for each piece, the nuggets S contained 94 wt % of the nuggets having a maximum length of 10 mm or more and 45 mm or less, and the median diameter of the nuggets S was 29 mm. The nuggets M contained 92 wt % of the nuggets having a maximum length of 20 mm or more and 70 mm or less, and the median diameter of the nuggets M was 49 mm. The nuggets L contained 94 wt % of the nuggets having a maximum length of 60 mm or more and 100 mm or less, and the median diameter of the nuggets L was 79 mm.

The polycrystalline silicon material obtained by etching was placed in the container on which the polyethylene sheet was covered for each size and air-dried, in the same manner as in Example 1. In this case, the weight of the polycrystalline silicon material placed in the container was 150 kg for each size. The contact area between the polycrystalline silicon material and the polyethylene sheet was 1.7 m². The amount of air supplied to the polycrystalline silicon material during the air-drying was 40 m³/min. The dopant concentration in the supplied air was measured. As a result, the B concentration was 19 ng/m³, and the Al concentration, the P concentration, and the As concentration were all equal to or less 1 ng/m³, which was the lower limit of quantification.

As the polyethylene sheet for protective covering, the LLDPE sheet containing phosphoric acid esters was used. The amounts of dopants on the surface of this sheet were measured. As a result, the P concentration was 15 ng/cm², the Al concentration was 2 ng/cm², and the B concentration and the As concentration were both 1 ng/cm², which was the lower limit of quantification.

Similar to Example 1, the air-drying time of the nuggets was 6 hours for the nugget S, 15 hours for the nuggets M, and 36 hours for the nuggets L. After the air drying, 5 kg of each size was packed in the polyethylene packaging bag, and the opening of the packaging bag was sealed with heat seal.

5 kg of the polycrystalline silicon nuggets were extracted for each size from the sealed polyethylene packaging bag, and each surface dopant concentration was calculated in the same manner as in Example 1. Results are shown in Table 9.

TABLE 9

| | Surface dopant concentration | | | | | |
|---|---|---|---|---|---|---|
| | Surface donor concentration [ppta] | | Surface acceptor concentration [ppta] | | Cd2 | Ca2 |
| Sample | P | As | B | Al | [ppta] | [ppta] |
| Nuggets S | 10 | <1 | 43 | 4 | 10 | 47 |
| Nuggets M | 12 | <1 | 48 | 3 | 12 | 51 |
| Nuggets L | 10 | <1 | 45 | 6 | 10 | 51 |

Using the obtained polycrystalline silicon nugget, silicon single crystal having a straight body length of 1600 mm and a diameter of 200 mm was obtained by the CZ method in the same manner as in Example 1.

In the same manner as in Example 1, the conduction type and the specific resistance value of the obtained silicon single crystal were measured. Results are shown in Table 10.

TABLE 10

| | Polycrystalline silicon material | | | | | | Silicon single crystal | | | |
|---|---|---|---|---|---|---|---|---|---|---|
| | Raw | | | | | | Top side | | Tail side | |
| Sample No. | material used | Dopant concentration [ppta] | | | | | Conduction type | Resistivity [Ωcm] | Conduction type | Resistivity [Ωcm] |
| | | Cd1 | Cd2 | Ca1 | Ca2 | C* | | | | |
| 13 | Nuggets S | 13 | 10 | 3 | 47 | 27 | P | 10400 | P | 9700 |
| 14 | Nuggets M | 13 | 12 | 3 | 51 | 29 | P | 9900 | P | 9500 |
| 15 | Nuggets L | 13 | 10 | 3 | 51 | 31 | P | 9200 | P | 8700 |

C* = (Ca1 + Ca2) − (Cd1 + Cd2)

From Table 10, for the silicon single crystal ingot of Sample No. 13, the conduction type was p-type, and the resistivity on the top side was 10,000 [Ωcm] or more, but it was less than 10,000 [Ωcm] after a position where the straight body length was 750 mm from the top side. For the silicon single crystal ingots of Sample No. 14 and Sample No. 15, although the conduction type was p-type, the resistivity was kept at 10,000 [Ωcm] or less from the top side.

Therefore, it was confirmed that when the relation between the bulk dopant concentration and the surface dopant concentration is larger than the above range, the resistivity of the silicon single crystal ingot is smaller than 10,000 [Ωcm].

The invention claimed is:

1. A polycrystalline silicon material for producing a p-type silicon single crystal, comprising:
    a plurality of polycrystalline silicon chunks, wherein
        a total concentration of donor elements present inside a bulk body of the polycrystalline silicon material is Cd1 [ppta],
        a total concentration of acceptor elements present inside the bulk body of the polycrystalline silicon material is Ca1 [ppta],
        a total concentration of the donor elements present on a surface of the polycrystalline silicon material is Cd2 [ppta], and
        a total concentration of the acceptor elements present on the surface of the polycrystalline silicon material is Ca2 [ppta],
    wherein Cd1, Ca1, Cd2, and Ca2 satisfy a relation of 5 [ppta]≤(Ca1+Ca2)−(Cd1+Cd2)≤26 [ppta].

2. The polycrystalline silicon material according to claim 1, wherein a total weight of the polycrystalline silicon chunks contained in the polycrystalline silicon material is 100%, a weight of polycrystalline silicon chunks having a maximum length of 10 mm or more and 45 mm or less is 90% or more.

3. The polycrystalline silicon material according to claim 1, wherein a total weight of the polycrystalline silicon chunks contained in the polycrystalline silicon material is 100%, a weight of polycrystalline silicon chunks having a maximum length of 20 mm or more and 70 mm or less is 90% or more.

4. The polycrystalline silicon material according to claim 1, wherein a total weight of the polycrystalline silicon chunks contained in the polycrystalline silicon material is 100%, a weight of polycrystalline silicon chunks having a maximum length of 60 mm or more and 100 mm or less is 90% or more.

5. The polycrystalline silicon material according to claim 1, wherein Cd1, Ca1, Cd2, and Ca2 satisfy a relation of 10 [ppta] less than or equal to (Ca1+Ca2)−(Cd1+Cd2) less than or equal to 20 [ppta].

6. The polycrystalline silicon material according to claim 1, wherein the donor elements present inside a bulk body of the polycrystalline silicon material comprise phosphorous and arsenic and the acceptor elements present inside a bulk body of the polycrystalline silicon material comprise boron and aluminum.

7. The polycrystalline silicon material according to claim 1, wherein the donor elements present on a surface of the polycrystalline silicon material comprise phosphorous and the acceptor elements present on a surface of the polycrystalline silicon material comprise boron and aluminum.

8. The polycrystalline silicon material according to claim 1, wherein:
Ca1 is in a range of 1 [ppta] to 4 [ppta];
Ca2 is in a range of 1 [ppta] to 100 [ppta];
Cd1 is in a range of 1 [ppta] to 80 [ppta]; and
Cd2 is in a range of 1 [ppta] to 50 [ppta].

\* \* \* \* \*